US011112450B2

(12) United States Patent
Lu

(10) Patent No.: US 11,112,450 B2
(45) Date of Patent: Sep. 7, 2021

(54) METHOD AND APPARATUS FOR CONTROLLING TESTER, MEDIUM AND ELECTRONIC DEVICE

(71) Applicant: Changxin Memory Technologies, Inc., Anhui (CN)

(72) Inventor: Yubin Lu, Hefei (CN)

(73) Assignee: Changxin Memory Technologies, Inc., Anhui (CN)

( * ) Notice: Subject to any disclaimer, the term of this patent is extended or adjusted under 35 U.S.C. 154(b) by 0 days.

(21) Appl. No.: 17/169,355

(22) Filed: Feb. 5, 2021

(65) Prior Publication Data

US 2021/0156905 A1    May 27, 2021

Related U.S. Application Data

(63) Continuation of application No. PCT/CN2019/104510, filed on Sep. 5, 2019.

(30) Foreign Application Priority Data

Sep. 11, 2018   (CN) .......................... 201811058604.6
Sep. 11, 2018   (CN) .......................... 201821483013.9

(51) Int. Cl.
  *G01R 31/28*        (2006.01)
  *G05B 15/02*        (2006.01)
  *G01H 11/06*        (2006.01)

(52) U.S. Cl.
  CPC ......... *G01R 31/2851* (2013.01); *G01H 11/06* (2013.01); *G05B 15/02* (2013.01)

(58) Field of Classification Search
  CPC .... G01R 31/28; G01R 31/2851; G01R 35/02; G05B 15/02; G01H 11/06; G01H 11/00;
  (Continued)

(56) References Cited

U.S. PATENT DOCUMENTS 8,373,587 B2 *   2/2013   Tsukamoto ......... H03M 1/1061
                                                341/159
8,410,807 B2     4/2013   Umemura et al.

FOREIGN PATENT DOCUMENTS

CN       1086900   *   5/1994   ............. G01F 23/26
CN       1949493   *   4/2007   ............. H01L 24/43
                  (Continued)

OTHER PUBLICATIONS

Jay Steele, Development of a Shock & Vibration Spec for 300mm Wafer AMHS Handling, 2006 IEEE, 6 pages (Year: 2006).*

(Continued)

*Primary Examiner* — Tung S Lau
(74) *Attorney, Agent, or Firm* — Sheppard Mullin Richter & Hampton LLP

(57) ABSTRACT

A method and apparatus for controlling a tester, related medium and electronic device are provided. The apparatus includes a vibration data collector attached on a side wall of the tester to collect vibration data from the tester during operation thereof. The method includes: receiving the vibration data collected by the vibration data collector; comparing the vibration data with a predetermined threshold to generate a comparison result; and controlling an operating state of the tester based on the comparison result. This method may timely identify any instability of the tester and prompt for repair if necessary. It substantially reduces the time and material costs associated with a test, and thus reduces the non-chip-attributable defect rate.

20 Claims, 3 Drawing Sheets

(58) Field of Classification Search
CPC ........ H03M 1/1061; H01L 24/43; G02F 1/13; H04L 43/08; G06F 1/1694; G01F 23/26
See application file for complete search history.

(56) References Cited

FOREIGN PATENT DOCUMENTS

| CN | 101030518 | A | | 9/2007 | |
|----|-----------|---|---|--------|---|
| CN | 101324462 | | * | 12/2008 | ............ G01H 11/00 |
| CN | 101769974 | A | | 7/2010 | |
| CN | 101566742 | | * | 12/2010 | ............... G02F 1/13 |
| CN | 102017115 | A | | 4/2011 | |
| CN | 104656602 | | * | 5/2015 | ............. H04L 43/08 |
| CN | 205176248 | | * | 4/2016 | ............. G01R 35/02 |
| CN | 106500831 | A | | 3/2017 | |
| CN | 107576346 | A | | 1/2018 | |
| CN | 109283450 | A | | 1/2019 | |
| CN | 208833883 | U | | 5/2019 | |
| CN | 110187757 | | * | 9/2020 | ........... G06F 1/1694 |
| JP | 2000-241507 | A | | 9/2000 | |
| WO | WO 9604531 | | * | 2/1995 | ............. G01H 11/06 |

OTHER PUBLICATIONS

Todd Busch, Design of a Test Apparatus for Measuring the Low-Amplitude, Apr. 1, 2021 (Year: 2021).*
Lawrence R Corr, Comparison of low-frequency piezoelectric switching shunt techniques for structural damping, May 24, 2002, 8 pages (Year: 2002).*
Y Chiu, A capacitive vibration-to-electricity energy converter with integrated mechanical switches, Published Sep. 29, 2008, 9 pages (Year: 2008).*
Łukasz Jedliński, Application of vibration signal in the diagnosis of IC engine valve clearance, 2014, 13 pages (Year: 2014).*
PCT International Search Report and the Written Opinion dated Nov. 28, 2019, issued in related International Application No. PCT/CN2019/104510 (9 pages).

* cited by examiner

METHOD AND APPARATUS FOR CONTROLLING TESTER, MEDIUM AND ELECTRONIC DEVICE

CROSS-REFERENCE TO RELATED APPLICATIONS

This application is a continuation application of International Patent Application No. PCT/CN2019/104510, filed on Sep. 5, 2019, which is based on and claims priority of the Chinese Patent Applications No. 201811058604.6 and 201821483013.9, both filed on Sep. 11, 2018. The above-referenced application is incorporated herein by reference in their entirety.

TECHNICAL FIELD

This disclosure relates generally to the field of electronic device and more specifically, to a method and apparatus for controlling a tester.

BACKGROUND

Contemporary testers for sophisticated electronic devices, such as an Integrated Circuit (IC) chip, have strict stability requirements in horizontal and vertical directions. Even a subtle swing of a test probe may cause failure or scrappage of the chip being tested, or even result in the scrappage of an entire wafer being tested.

Conventionally, to install a test probe of a tester, the test probe is first connected to and secured on a control arm by screws, and then docked to a docking arm, followed by tightening of the screws.

However, in a conventional system, there is no parameter to indicate the stability of the test probe, and no indicator to reflect any adverse mechanical condition, such as loose screws, during a test. As a result, any such adverse mechanical condition cannot be detected until it has led to anomalous testing results, a substantial reduction in yield, or damaged chip or wafer, at which time a substantial loss or damage has occurred.

It is to be noted that the above information disclosed in this Background section is only for facilitating the understanding of the background of the inventive concept and therefore may contain information that does not form the prior art that is already known to a person of ordinary skill in the art.

SUMMARY

In view of the limitations of existing technologies described above, this disclosure provides a method and apparatus for controlling an Integrated Circuit (IC) tester that address at least some of the aforementioned limitations, including reduced yield or damaged chip/wafer to an absence of tester ability assessment.

Additional features and advantages of this inventive concept will become apparent from the following detailed description or may be in part learned by practicing this inventive concept.

An exemplary embodiment of this inventive concept is directed to a tester control apparatus for controlling an IC tester. The tester control apparatus may be connected to a vibration data collector and the IC tester, and the vibration data collector may be coupled to a side wall of the IC tester for collecting vibration data from the IC tester during operation of the IC tester. The apparatus may comprise a reception module configured to receive, from the vibration data collector, the vibration data; a comparison module configured to compare the vibration data with a predetermined threshold to generate a comparison result; and a control module configured to control, based on the comparison result, an operating state of the IC tester.

In some embodiments, the vibration data collector may be an electronic level.

In some embodiments, the apparatus may be configured to reset the vibration data collector and define a reference horizon when the vibration data collector is just attached on the side wall of the IC tester.

In some embodiments, the apparatus may be further configured to: during operation of the IC tester, generate a plurality of deviation angles when the vibration data collector continuously deviates from the reference horizon with the vibration of the IC tester, and the vibration data may be generated by converting the plurality of deviation angles into digital signals.

In some embodiments, the comparison module may be configured to: compare the vibration data with the predetermined threshold, generate a first comparison result if all the vibration data are smaller than the predetermined threshold, and generate a second comparison result if any of the vibration data is greater than or equal to the predetermined threshold.

In some embodiments, the control module may be configured to: if the comparison result is the first comparison result, determine that the IC tester is in a stable state, and continue to receive another comparison result; and, if the comparison result is the second comparison result, determine that the IC tester is in a non-stable state, generate an alert and send a control signal to cease current operation of the IC tester.

An exemplary embodiment of this inventive concept is directed to an IC tester, including a vibration data collector and a tester controller. The vibration data collector may be attached on a side wall of the IC tester for collecting vibration data from the tester during operation of the IC tester. The tester controller may be coupled to the vibration data collector for acquiring the vibration data collected from the tester during the operation of the IC tester.

In some embodiments, the vibration data collector may be an electronic level.

In some embodiments, the tester controller may be configured to receive the vibration data collected by the vibration data collector, and control an operating state of the IC tester based on the vibration data.

In some embodiments, when the vibration data collector is just attached on the side wall of the IC tester, the IC tester may be configured to reset the vibration data collector and define a reference horizon.

In some embodiments, the vibration data collector may be configured to generate a plurality of deviation angles when the vibration data collector continuously deviates from the reference horizon with the vibration of the IC tester, and generate the vibration data by converting the plurality of deviation angles into digital signals.

In some embodiments, the tester controller may be configured to compare the vibration data with a predetermine threshold, generate a first comparison result if all the vibration data are smaller than the predetermined threshold, and generate a second comparison result if any of the vibration data is greater than or equal to the predetermined threshold.

An exemplary embodiment of this inventive concept is directed to a method for controlling an IC tester. The method may include: receiving vibration data from a vibration data collector; comparing the vibration data with a predetermined threshold to generate a comparison result; and controlling an operating state of the IC tester based on the comparison result. The vibration data collector may be coupled to a side wall of the IC tester for collecting vibration data from the IC tester during operation of the IC tester.

In some embodiments, the vibration data collector may be an electronic level.

In some embodiments, the method may further include: when the vibration data collector is just attached on the side wall of the IC tester, resetting the vibration data collector and defining a reference horizon.

In some embodiments, the method may further include, after the reference horizon is defined, generating a plurality of deviation angles when the vibration data collector continuously deviates from the reference horizon during operation of the IC tester; and producing the vibration data by converting the plurality of deviation angles into digital signals.

In some embodiments, comparing the vibration data with a predetermined threshold to generate a comparison result may include: comparing the vibration data with the predetermined threshold; generating a first comparison result if all the vibration data are smaller than the predetermined threshold; and generating a second comparison result if any of the vibration data is greater than or equal to the predetermined threshold.

In some embodiments, controlling an operating state of the IC tester may include: if the comparison result is the first comparison result, determining that the IC tester is in a stable state, continuing to receive another vibration result and compare the received vibration result with the predetermined threshold; and, if the comparison result is the second comparison result, determining that the IC tester is in a non-stable state, generating an alert and sending a control signal to the IC tester to cease current operation of the IC tester.

An exemplary embodiment of this inventive concept is directed to a computer readable medium storing a computer program. When the program is executed by a processor, the processor may perform the method for controlling an IC tester described in any of the aforementioned embodiments.

An exemplary embodiment of this inventive concept is directed to an electronic device, including: one or more processors; and a storage device storing one or more programs. When the one or more programs are executed by the one or more processors, the one or more processors may perform the method for controlling an IC tester described in any of the aforementioned embodiments.

Embodiments of the present disclosure offer the following benefits. According to some embodiments of this inventive concept, a vibration data collector may be attached on a side wall of the tester so as to collect vibration data from the tester during operation of the tester, and a tester controller, coupled wirelessly to the vibration data collector and electrically connected to the tester, may receive the vibration data collected by the vibration data collector and then compare them with a predetermined threshold to generate a comparison result, which may serve as a basis for controlling an operating state of the tester. Therefore, according to these embodiments of this inventive concept, any instability of the tester can be timely identified and referred to repair if necessary, leading to substantial reductions in the time and material costs associated with a test, as well as a reduction of the non-chip-attributable defect rate.

It is to be understood that both the foregoing general description and the following detailed description are exemplary and explanatory only and are not restrictive of this inventive concept.

BRIEF DESCRIPTION OF THE DRAWINGS

The accompanying drawings, which are incorporated in and constitute a part of the description, illustrate embodiments consistent with this inventive concept and, together with the description, serve to explain the disclosed principles. It is apparent that these drawings present only some embodiments of this inventive concept and those of ordinary skill in the art may obtain drawings of other embodiments from them without exerting any creative effort.

DETAILED DESCRIPTION OF THE EMBODIMENTS

Figure 1:
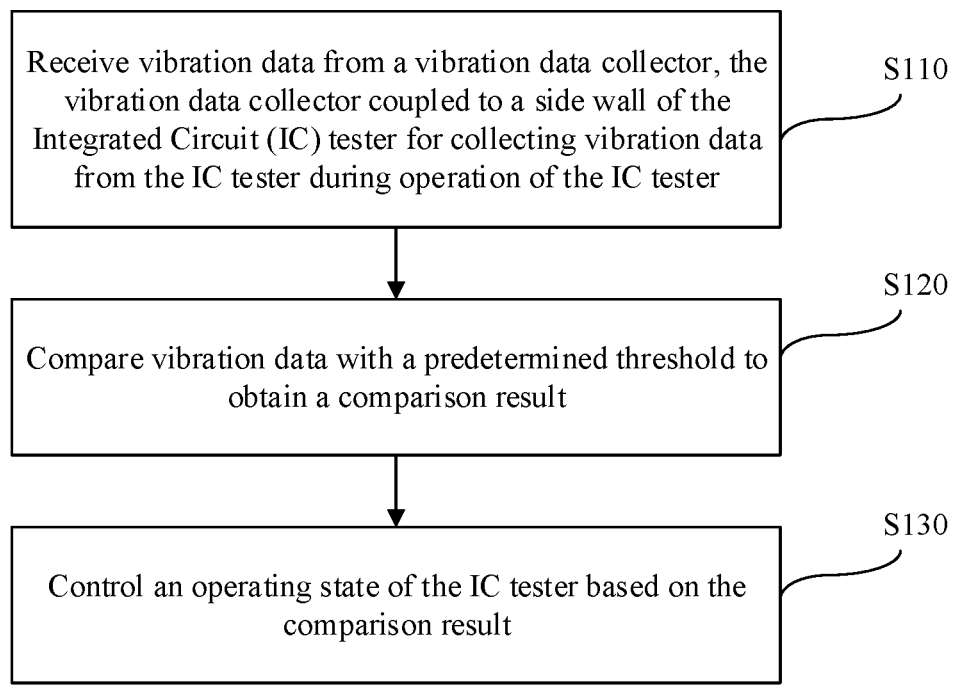
FIG. 1 is a schematic flowchart illustrating a method for controlling a tester in accordance with one embodiment of this inventive concept.

Exemplary embodiments will now be described more fully with reference to the accompanying drawings. However, these exemplary embodiments can be implemented in many forms and should not be construed as being limited to those set forth herein. Rather, these embodiments are presented to provide a full and thorough understanding of this inventive concept and to fully convey the concepts of the embodiments to others skilled in the art.

In addition, the described features, structures, and characteristics may be combined in any suitable manner in one or more embodiments. In the following detailed description, many specific details are set forth to provide a more thorough understanding of the present disclosure. However, those skilled in the art will recognize that the various embodiments can be practiced without one or more of the specific details or with other methods, components, materials, or the like. In some instances, well-known structures, materials, or operations are not shown or not described in detail to avoid obscuring aspects of the embodiments.

The represented blocks in the drawings are purely functional entities, which do not necessarily correspond to physically separate entities. In other words, these functional entities may be implemented as software, or entirely or in part in one or more software-hardened modules, or in different networks and/or processor devices and/or microcontroller devices.

The flowchart illustrated in the drawings is merely illustrative, and it neither necessarily includes all features and operations/steps, nor is necessarily performed in the illustrated order. For example, some of these operations/steps may be divided, while some can be at least partially combined. Therefore, the actual order in which they are performed may vary depending on actual conditions.

FIG. 1 is a schematic flowchart illustrating a method for controlling a tester in accordance with one embodiment of this inventive concept. In this disclosure, a "tester" may refer to a device or apparatus that tests an IC chip, i.e., an IC tester.

As shown in FIG. 1, the method for controlling a tester may include the following steps S110 through S130.

In step S110, vibration data collected by a vibration data collector is received.

In step S120, the vibration data is compared with a predetermined threshold to obtain a comparison result.

In step S130, an operating state of the tester is controlled based on the comparison result.

In the method shown in FIG. 1, vibration data from a tester may be collected to determine the stability of the tester. If, based on the vibration data, the tester is determined to be not operating stably, current operation of the tester may be creased. Through this method, any instability of the tester can be timely identified and referred to repair if necessary, leading to substantial reductions in the time and material costs associated with a test, as well as a reduction of the non-chip-attributable defect rate.

The steps shown in FIG. 1 will be described in greater details below.

In step S110, the vibration data collected by the vibration data collector is received.

In some embodiments, the vibration data collector may be an electronic level.

In some embodiments, the vibration data collector may be attached on a side wall of the tester so that the vibration data collector may tilt along with the tester, and thus be able to collect the vibration data from the tester.

In some embodiments, the vibration data collector may be, by means of, for example, adhesion or detachable embedment, etc., directly or indirectly attached on the side wall of the tester.

In some embodiments, the side wall of the tester on which the vibration data collector is attached may be any of its side walls. For improved accuracy of the collected vibration data, the vibration data collector may be attached on a side wall of a test probe of the tester.

In the embodiments described above, the vibration data collector may be attached on the side wall of the tester. When the vibration data collector is first attached, or re-attached after being detached, on the side wall of the tester, the vibration data collector may be reset, and a reference horizon may be determined.

In the embodiments described above, during operation of the tester, the vibration data collector may continuously deviate from the reference horizon along with the tester, thereby generating a plurality of deviation angles which may be converted into digital signals to produce the vibration data.

In some embodiments, the vibration data may be collected by an inductive vibration data collector or a capacitive vibration data collector. When the vibration data collector is an inductive vibration data collector, a base of the inductive vibration data collector may tilt along with the tester, and a pendulum within the vibration data collector may move to cause voltage changes across an induction coli. A deviation angle may be derived from the voltage changes. When the vibration data collector is a capacitive vibration data collector, a circular pendulum may be provided within the data collector, which may be suspended by a thin thread so that it can swing freely without friction. Moreover, electrodes may be arranged on both sides of the pendulum equidistantly therefrom so that equal capacitances are present on the opposing sides of the pendulum. When a base of the capacitive vibration data collector tilts along with the tester, the distances of the pendulum from the electrodes, and hence the capacitances on both sides of the pendulum, will change while the pendulum remains perpendicular to the ground under the action of the gravity. The deviation angles may be derived from the changes in the capacitances.

In the embodiments described above, the vibration data collector may collect the deviation angles of the tester and convert them into digital signals for transmission to a tester controller.

In step S120, the vibration data may be compared with the predetermined threshold, and a comparison result may be generated.

In some embodiments, the tester controller may compare the vibration data with the predetermined threshold. If all the vibration data are smaller than the predetermined threshold, a first comparison result may be obtained. If any of the vibration data is greater than or equal to the predetermined threshold, a second comparison result may be obtained.

In some embodiments, the tester controller may determine the threshold based on an elasticity of a spring-loaded test pin in the tester. For example, assuming the spring-loaded test pin may swing in an angular range of ±0.5 degrees during normal operation of the tester, in order for the spring-loaded test pin to signal any unstable condition of the tester in an early stage, the threshold may be set to ±0.4 degrees. Thus, when the all the collected tester vibration data are within the threshold of ±0.4 degrees, the first comparison result will be generated, indicating that the tester is operating stably (in a stable state). Otherwise, if any of the data is beyond the threshold of ±0.4 degrees, the second comparison result will be generated to indicate that the tester is operating or will soon be operating unstably (in a non-stable state).

In step S130, based on the comparison result, an operating state of the tester may be controlled.

In some embodiments, when the comparison result is the first comparison result, the tester controller may determine that the tester is operating stably and continue to receive another comparison result. If the comparison result is the second comparison result, the tester controller may determine that the tester is operating unstably, and it may raise an alert about unstable operation of the tester and send a control signal to the tester to cease current operation of the tester.

In the embodiments described above, after the vibration data collected by the vibration data collector is received, the vibration data may be compared with the predetermined threshold to generate a comparison result which may serve as a basis for controlling the operating state of the tester. According to these embodiments, any instability of the tester can be timely identified and referred to repair if necessary, leading to substantial reductions in the time and material costs associated with a test, as well as a reduction of the non-chip-attributable defect rate.

This inventive concept further provides, based on the aforementioned method, an apparatus for controlling a tester. Embodiments of the apparatus will be described below.

Figure 2:
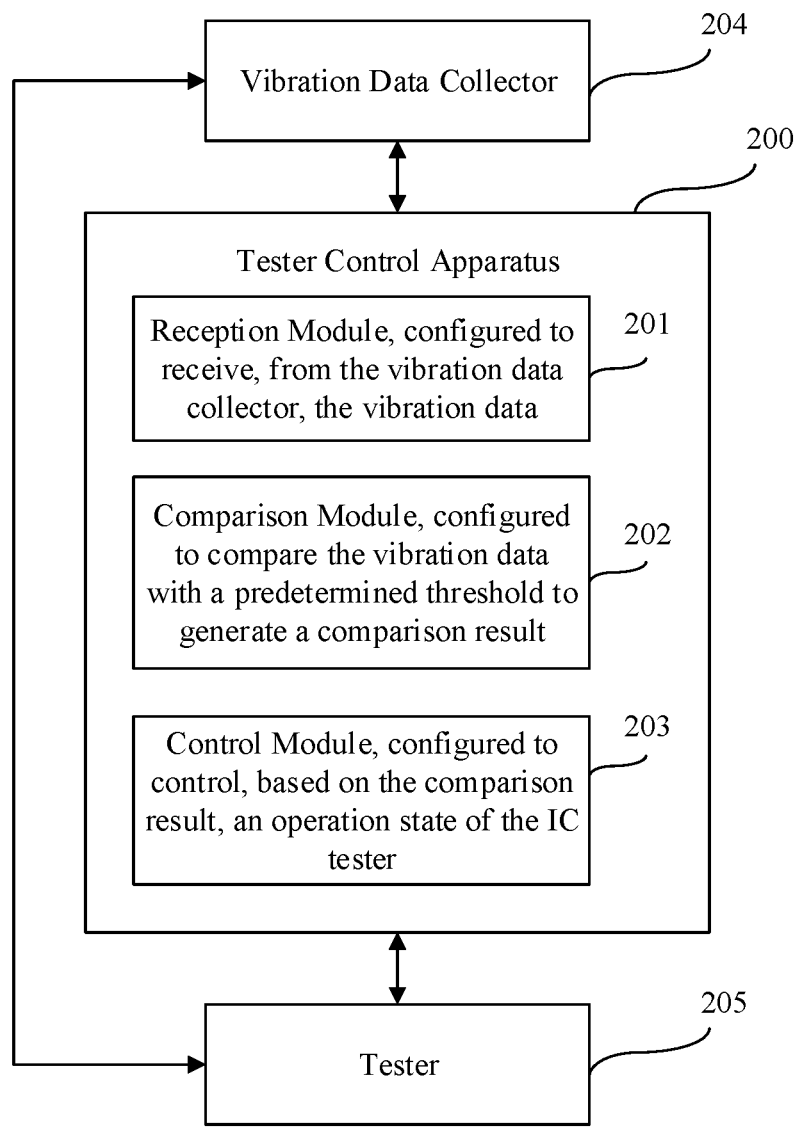
FIG. 2 is a schematic block diagram illustrating an apparatus for controlling a tester in accordance with one embodiment of this inventive concept.

FIG. 2 is a schematic block diagram illustrating an apparatus for controlling a tester in accordance with one embodiment of this inventive concept.

Referring to FIG. 2, the apparatus 200 for controlling a tester may include a reception module 201, a comparison module 202 and a control module 203.

The reception module 201 may be configured to receive the vibration data collected by the vibration data collector.

The comparison module 202 may be configured to compare the vibration data with a predetermined threshold to generate a comparison result.

The control module 203 may be configured to control an operating state of a tester based on the comparison result.

In some embodiments, the apparatus 200 for controlling a tester may be coupled to a vibration data collector 204 and the tester 205. The tester 205 may have a side wall on which the vibration data collector 204 may be attached in order to collect vibration data from the tester 205 during operation of the tester.

In some embodiments, the vibration data collector 204 may be an electronic level.

In some embodiments, a wireless communication module may be provided between the vibration data collector 204 and the apparatus 200 for controlling a tester, so that the vibration data collector 204 and the apparatus 200 for controlling a tester may communicate data over a wireless network. For example, the vibration data collected by the vibration data collector 204 may be transmitted in the form of packets to the apparatus 200 for controlling a tester over the wireless network. In this way, fast, accurate, real-time acquisition of the vibration data from the tester 205 is possible without substantially modifying conventional testers.

In some embodiments, the apparatus 200 for controlling a tester may be further configured so that when the vibration data collector 204 is just attached on the side wall of the tester 205, the vibration data collector 204 is reset, and a reference horizon is defined.

In some embodiments, the apparatus 200 for controlling a tester may be further configured so that, during operation of the tester 205, the vibration data collector 204 may continuously deviate from the reference horizon along with vibration of the tester 205, thereby generating a plurality of deviation angles. The vibration data may be produced by converting the plurality of deviation angles into digital signals.

In some embodiments, the comparison module 202 may be more specifically configured to: compare the vibration data with the predetermined threshold; if all the vibration data are smaller than the predetermined threshold, generate a first comparison result; and if any of the vibration data is greater than or equal to the predetermined threshold, generate a second comparison result.

In some embodiments, the control module 203 may be more specifically configured to: if the comparison result is the first comparison result, determine that the tester 205 is operating stably (in a stable state) and continue to receive another comparison result; and if the comparison result is the second comparison result, determine that the tester 205 is operating unstably (in a non-stable state), generate an alert about unstable operation of the tester and send a control signal to the tester 205 to cease current operation of the tester 205.

Figure 3:
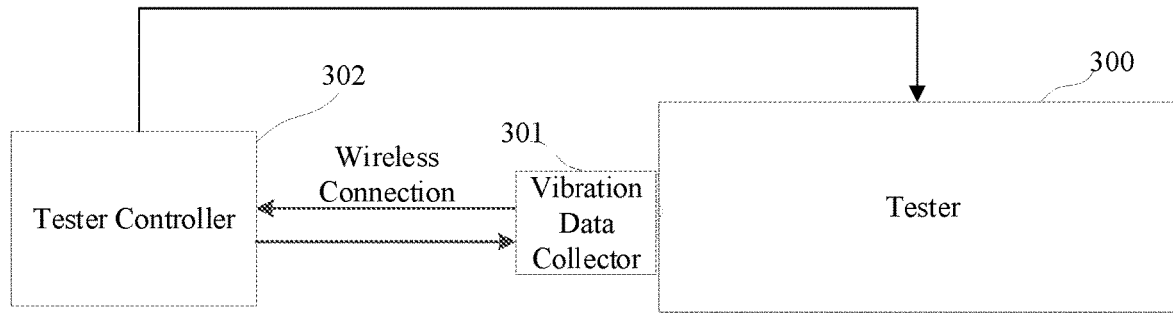
FIG. 3 is a schematic block diagram illustrating a tester in accordance with one embodiment of this inventive concept.

FIG. 3 is a schematic block diagram illustrating a tester in accordance with one embodiment of this inventive concept.

As shown in FIG. 3, the tester 300 may have a side wall on which a vibration data collector 301 may be attached to collect vibration data from the tester 300 during operation of the tester 300. A tester controller 302 may be coupled to the vibration data collector 301 as to be able to acquire the vibration data collected during the operation of the tester 300. The tester controller 302 may further be electrically coupled to the tester 300.

In some embodiments, the vibration data collector 301 may be an electronic level.

In some embodiments, the tester controller 302 may be configured to receive the vibration data collected by the vibration data collector 301, compare the vibration data with a predetermined threshold to generate a comparison result, and control an operating state of the tester 300 based on the comparison result.

In some embodiments, the vibration data collector 301 may be calibrated either by the tester controller 302 or by itself. For example, when the vibration data collector 301 is just attached on the side wall of the tester 300, the tester controller 302 may reset the vibration data collector 301 so as to define a reference horizon.

Alternatively, when the vibration data collector 301 is just attached on the side wall of the tester 300, the vibration data collector 301 may reset itself so as to define a reference horizon.

In some embodiments, a wireless communication module may be provided between the vibration data collector 301 and the tester controller 302, so that the vibration data collector 301 and the tester controller 302 may communicate data over a wireless network. For example, the vibration data collected by the vibration data collector 301 may be transmitted in the form of packets to the tester controller 302 over the wireless network. In this way, fast, accurate, real-time acquisition of the vibration data from the tester 300 is possible without substantially modifying conventional testers.

In some embodiments, the vibration data collector 301 may be attached on a side wall of a test probe of the tester 300 for improved accuracy of the collected vibration data of the tester 300.

In some embodiments, the tester controller 302 may select the threshold from a range. For example, assuming the vibration data collector 301 collect the data with an accuracy of 0.1 degree and a spring-loaded test pin of the tester 300 have an elasticity in the range of ±0.5 degrees, in order for the spring-loaded test pin to signal any unstable condition of the tester in an early stage, the threshold may be set to ±0.4 degrees. Thus, if any of the vibration data received by the tester controller 302 goes beyond the threshold of ±0.4 degrees, the tester 300 will be determined to be operating unstably and its operation will be creased, and an alert will be generated.

The hardware devices in the apparatus embodiments of this inventive concept may correspond to the respective counterparts in the method embodiments, reference can be made to the method embodiments for any detail not disclosed in the apparatus embodiments.

Figure 4:
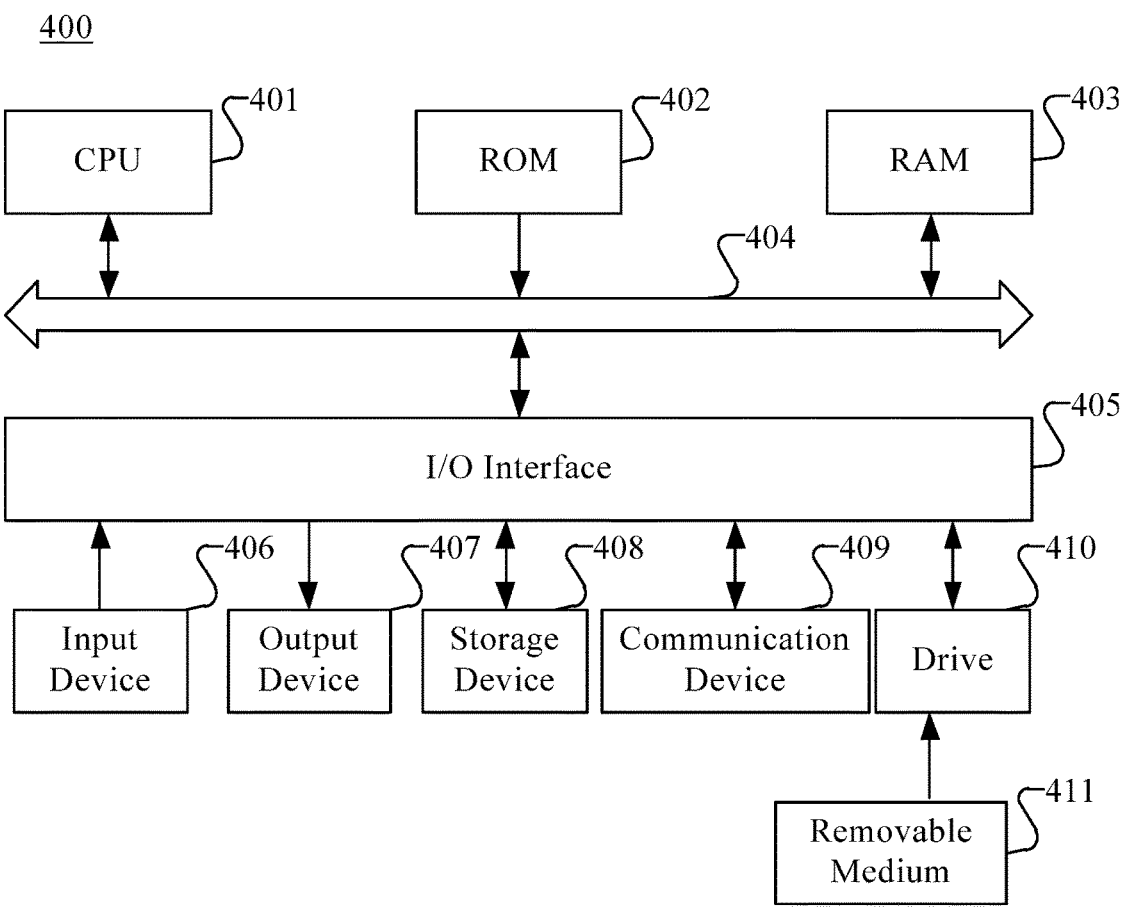
FIG. 4 is a structural schematic diagram of a computer system of an electronic device in accordance with one embodiment of this inventive concept.

FIG. 4 is a structural schematic diagram of a computer system 400 of an electronic device in accordance with one embodiment of this inventive concept. The computer system 400 of an electronic device shown in FIG. 4 is merely an example and should not be construed as limiting the functionality or application of the embodiments of this inventive concept in any sense.

As shown in FIG. 4, the computer system 400 may include a central processing unit (CPU) 401 which can perform various appropriate actions and processes as instructed by a program stored in a read only memory (ROM) 402 or loaded into a random access memory (RAM) 403 from a storage device 408. The RAM 403 may also store various programs and data necessary for the operation of the system. The CPU 401, the ROM 402 and the RAM 403 may be connected to one another by a bus 404. In addition, an input/output (I/O) interface 405 may also be connected to the bus 404.

Additional components, including an input device 406 such as a keyboard, a mouse, etc., an output device 407 such as a cathode ray tube (CRT), a liquid crystal display (LCD), a speaker, etc., a storage device 408 such as a hard drive, and a communication device 409 of a network interface card such as a local area network (LAN) card, a modem, etc., may also be connected to the I/O interface 405. The communication device 409 may be configured to perform communications over a network such as the Internet. A drive 410 may also be connected to the I/O interface 405 if necessary. A removable medium 411, such as a magnetic disk, an optical disk, a magneto-optical disk, a semiconductor memory or the like, may be mounted on the drive 410 as needed so that a computer program read therefrom can be loaded into the storage device 408 when needed.

In particular, according to embodiments of this inventive concept, the process described above with reference to the flowchart may be implemented as a computer software program. For example, in some embodiments, a computer program product including a computer program stored in a computer readable medium may be provided. The computer program may include program code for implementing the method illustrated in the flowchart. In such an embodiment, the computer program may be downloaded from a network via the communication device 409 and installed, and/or installed from the removable medium 411. When this computer program is executed by the central processing unit (CPU) 401, it may perform the above-described functions as defined in the system disclosed herein.

It should be noted that the computer readable medium of this inventive concept may be a computer readable signal medium, a computer readable storage medium or any combination of them. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this inventive concept, a computer readable storage medium may be any tangible medium that can contain, or store a program for use by or in connection with an instruction execution system, apparatus, or device. In the context of this disclosure, a computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

The aforementioned flowchart and block diagrams illustrate the architecture, functionality, and operation of possible implementations of systems, methods and computer program products according to various embodiments of this inventive concept. In this regard, each block in the flowchart or block diagrams may represent a module, segment, or portion of code, which includes one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The various units involved in the embodiments of this inventive concept may be implemented either by software or by hardware. Alternatively, the described units may also reside in processor(s). In some instances, the designations of these units do not limit the units themselves at all.

In another aspect, there is also provided herein a computer readable medium, which may be either included in the electronic device described in the above embodiments, or separately present without being assembled into the electronic device. The computer readable medium may store thereon one or more programs, which, when executed by the electronic device, cause the electronic device to implement the method as defined above.

For example, the electronic device may accomplish, as shown in FIG. 1, the reception of the vibration data collected by the vibration data collector in step S110, the obtainment of the comparison result from the comparison of the vibration data with the predetermined threshold in step S120, and the control of the operating state of the tester based on the comparison result in step S130.

It should be noted that, although a certain device for performing some actions may have been described in the above detailed description as including several modules or components, such division is not mandatory. In fact, according to embodiments of this inventive concept, the features or functions of two or more of said modules or components may also be embodied in a single module or component. On the contrary, the feature(s) or function(s) of one of said modules or components may be further divided so as to be embodied in multiple modules or components.

From the description of the above embodiments, it will be readily appreciated by those skilled in the art that the exemplary embodiment disclosed herein may be implemented either by software or by software in combination with necessary hardware. Therefore, the embodiments of the present disclosure can be embodied in a software product which may be stored in a non-volatile storage medium (e.g., a CD-ROM, USB flash drive, portable hard drive, etc.) or in a network and may include a number of instructions for causing a computing device (e.g., a PC, server, touch terminal, network device, etc.) to implement the method of this inventive concept.

Other embodiments of the present disclosure will be apparent to those skilled in the art from considering the specification and practicing the inventive concept disclosed herein. Accordingly, this disclosure is intended to cover all and any variations, uses, or adaptations of the disclosure which follow, in general, the principles thereof and include such departures from the present disclosure as come within common knowledge or customary practice within the art to which this inventive concept pertains. It is also intended that the specification and examples be considered as exemplary only, with true scope and spirit of the disclosure being indicated by the appended claims.

It is to be understood that the present disclosure is not limited to the exact structures as described above and illustrated in the figures and may be modified or changed without departing from its scope. The scope of the disclosure is intended to be defined only by the appended claims.

The invention claimed is:

1. A tester control apparatus for controlling an Integrated Circuit (IC) tester, the tester control apparatus connected to a vibration data collector and the IC tester, the vibration data collector coupled to a side wall of the IC tester for collecting vibration data from the IC tester during operation of the IC tester, wherein the tester control apparatus comprises:
    a reception module configured to receive, from the vibration data collector, the vibration data;
    a comparison module configured to compare the vibration data with a predetermined threshold to generate a comparison result; and
    a control module configured to control, based on the comparison result, an operating state of the IC tester.

2. The apparatus of claim 1, wherein the vibration data collector is an electronic level.

3. The apparatus of claim 1, is configured to:
    when the vibration data collector is just attached on the side wall of the IC tester, reset the vibration data collector and define a reference horizon.

4. The apparatus of claim 3, wherein the vibration data collector is further configured to:
    during the operation of the IC tester, generate a plurality of deviation angles when the vibration data collector continuously deviates from the reference horizon with the vibrate of the IC tester, and wherein the vibration data is generated by converting the plurality of deviation angles into digital signals.

5. The apparatus of claim 1, wherein the comparison module is configured to:
    compare the vibration data with the predetermined threshold;
    generate a first comparison result if all the vibration data are smaller than the predetermined threshold; and
    generate a second comparison result if any of the vibration data is greater than or equal to the predetermined threshold.

6. The apparatus of claim 1, wherein the control module is configured to:
    if the comparison result is the first comparison result, determine that the IC tester is in a stable state, and continue to receive another comparison result; and
    if the comparison result is the second comparison result, determine that the IC tester is in a non-stable state, generate an alert and send a control signal to cease current operation of the IC tester.

7. An Integrated Circuit (IC) tester, comprising:
    a vibration data collector attached on a side wall of the IC tester for collecting vibration data from the IC tester during operation of the IC tester; and
    a tester controller, coupled to the vibration data collector for acquiring the vibration data collected from the IC tester during the operation of the IC tester.

8. The IC tester of claim 7, wherein the vibration data collector is an electronic level.

9. The IC tester of claim 7, wherein the tester controller is configured to receive the vibration data collected by the vibration data collector, and control, based on the vibration data, an operating state of the IC tester.

10. The IC tester of claim 7, wherein when the vibration data collector is just attached on the side wall of the IC tester, the IC tester is configured to reset the vibration data collector and define a reference horizon.

11. The IC tester of claim 10, wherein the vibration data collector is configured to:
    generate a plurality of deviation angles when the vibration data collector continuously deviates from the reference horizon with the vibration of the IC tester; and
    generate the vibration data by converting the plurality of deviation angles into digital signals.

12. The IC tester of claim 7, wherein the tester controller is configured to:
    compare the vibration data with a predetermined threshold;
    generate a first comparison result if all the vibration data are smaller than the predetermined threshold; and
    generate a second comparison result if any of the vibration data is greater than or equal to the predetermine threshold.

13. A method for controlling an Integrated Circuit (IC) tester, comprising:
    receiving, from a vibration data collector, vibration data, the vibration data collector coupled on a side wall of the IC tester for collecting vibration data from the IC tester during operation of the IC tester;
    comparing the vibration data with a predetermined threshold to generate a comparison result; and
    controlling, based on the comparison result, an operating state of the IC tester.

14. The method of claim 13, wherein the vibration data collector is an electronic level.

15. The method of claim 13, further comprising:
    when the vibration data collector is just attached on the side wall of the IC tester, resetting the vibration data collector and defining a reference horizon.

16. The method of claim 15, further comprising, after the reference horizon is defined:
    generating, by the vibration data collector, a plurality of deviation angles when the vibration data collector continuously deviates from the reference horizon during operation of the IC tester; and
    producing the vibration data by converting the plurality of deviation angles into digital signals.

17. The method of claim 13, wherein comparing the vibration data with a predetermined threshold to generate a comparison result comprises:
    comparing the vibration data with the predetermined threshold;
    generating a first comparison result if all the vibration data are smaller than the predetermined threshold; and
    generating a second comparison result if any of the vibration data is greater than or equal to the predetermined threshold.

18. The method of claim 17, wherein controlling an operating state of the IC tester comprises:
    if the comparison result is the first comparison result, determining that the IC tester is in a stable state, continuing to receive another vibration result and compare the received vibration result with the predetermined threshold; and
    if the comparison result is the second comparison result, determining that the IC tester is in a non-stable state, generating an alert and sending a control signal to the IC tester to cease current operation of the IC tester.

19. A computer readable medium storing a computer program, wherein when the computer program is executed by a processor, the processor performs the method of claim 13.

20. An electronic device, comprising:
one or more processors; and
a storage device storing one or more programs, wherein when the one or more programs are executed by the one or more processors, the one or more processors perform the method of claim 13.

\* \* \* \* \*